United States Patent
Eller et al.

(10) Patent No.: US 12,206,443 B2
(45) Date of Patent: Jan. 21, 2025

(54) SYSTEMS AND METHODS FOR FREQUENCY ADAPTIVE SPURIOUS SIGNAL SUPPRESSION

(71) Applicant: L3Harris Global Communications, Inc., Melbourne, FL (US)

(72) Inventors: Andrew Eller, Naples, NY (US); Kyle Holzer, Bountiful, UT (US)

(73) Assignee: L3HARRIS GLOBAL COMMUNICATIONS, INC., Rochester, NY (US)

( * ) Notice: Subject to any disclaimer, the term of this patent is extended or adjusted under 35 U.S.C. 154(b) by 302 days.

(21) Appl. No.: 17/665,133

(22) Filed: Feb. 4, 2022

(65) Prior Publication Data

US 2023/0254000 A1   Aug. 10, 2023

(51) Int. Cl.
  *H04B 1/18*   (2006.01)
  *H04B 1/04*   (2006.01)

(52) U.S. Cl.
  CPC ............. *H04B 1/18* (2013.01); *H04B 1/0475* (2013.01); *H04B 1/0483* (2013.01)

(58) Field of Classification Search
  None
  See application file for complete search history.

(56) References Cited

U.S. PATENT DOCUMENTS

| | | | |
|---|---|---|---|
| 4,325,140 A | 4/1982 | Stitzer | |
| 5,319,325 A | 6/1994 | Konishi | |
| 5,523,725 A | 6/1996 | Ishikawa et al. | |
| 5,923,228 A | 7/1999 | Okada et al. | |
| 6,473,596 B1 | 10/2002 | Stamper et al. | |
| 7,557,672 B1 | 7/2009 | Adam et al. | |
| 2015/0255846 A1 | 9/2015 | Sun et al. | |
| 2020/0044681 A1* | 2/2020 | Yokoyama | H04B 1/18 |
| 2020/0145098 A1* | 5/2020 | Zhou | H04J 14/0221 |

OTHER PUBLICATIONS

Zhang et al.: "Nonreciprocal Isolating Bandpass Filter With Enhanced Isolation Using Metallized Ferrite", IEEE Transactions on Microwave Theory and Techniques, vol. 68, No. 12, Dec. 2020.
Bongianni et al.: "Bandpass and Bandsectioning Filters Using Epitaxial YIG Films", G-MTT 1970 International Microwave Symposium, Conference Paper, 1970 IEEE.
Hussein et al., "Reflective Parametric Frequency-Selective Limiters With Sub-dB Loss and µWatts Power Thresholds," IEEE Transactions on Microwave Theory and Techniques, vol. 69, No. 6, pp. 2989-3000 (2021).
Phudpong and Hunter, "Nonlinear Matched Reflection Mode Bandstop Filters for Frequency Selective Limiting Applications," 2007 IEEE/MTT-S International Microwave Symposium, pp. 1043-1046 (2007).

* cited by examiner

*Primary Examiner* — Frantz Bataille
(74) *Attorney, Agent, or Firm* — Fox Rothschild LLP; Carol Thorstad-Forsyth

(57) ABSTRACT

Systems and methods for operating a communication device. The methods comprise: obtaining a signal; allowing the signal to pass through a junction of a communication path to which a reflective frequency selective limiter is coupled; attenuating unwanted components of the signal using the reflective frequency selective limiter; and reflecting remaining components of the signal by the reflective frequency selective limiter so that the remaining components travel downstream along the communication path.

24 Claims, 11 Drawing Sheets

SYSTEMS AND METHODS FOR FREQUENCY ADAPTIVE SPURIOUS SIGNAL SUPPRESSION

BACKGROUND

Statement of the Technical Field

The present document concerns communication systems. More specifically, the present document concerns systems and methods implementing frequency adaptive spurious signal suppression technology.

Description of the Related Art

There are many communication devices known in the art. Such communication devices include, but are not limited to, satellite communication devices and/or radios. The communication devices may experience interference resulting from other communication signals. This interference can degrade performance of the communication devices.

SUMMARY

This document concerns systems and methods for operating a communication device. The methods comprise: obtaining a signal by the communication device; allowing the transmit signal to pass through a first junction of a communication path to which a first reflective frequency selective limiter is coupled; attenuating first unwanted components of the signal using the first reflective frequency selective limiter; and reflecting remaining transmit signal of interest (Tx SOI) components of the signal by the first reflective frequency selective limiter so that the remaining Tx SOI components travel downstream along the communication path.

In some scenarios, the methods also comprise creating a short circuit termination or an open circuit termination for the first reflective frequency selective limiter to facilitate the attenuation of the first unwanted components of the signal. An electrical length between the first junction and the short circuit termination may be equal to 180° plus n multiplied by 180°. In contrast, the electrical length between the first junction and the open circuit termination may be equal to 90° plus n multiplied by 180°. n is an integer equal to or greater than zero. The open circuit termination can include, but is not limited to, an open wire, a microstrip, a waveguide, a strip line, a radial stub, and/or a filter integrated stub.

In some scenarios, the methods also comprise creating a short circuit reflection or an open circuit reflection for the first reflective frequency selective limiter to facilitate the reflection of the first Tx SOI signal to travel unaltered downstream along the communication path. An electrical length between the first junction and the short circuit reflection may be equal to 90° plus n multiplied by 180°. In contrast, the electrical length between the first junction and the open circuit reflection may be equal to 0° plus n multiplied by 180°. n is an integer equal to or greater than zero. Both the short circuit and open circuit reflections can include, but are not limited to, an open wire, a microstrip, a waveguide, a strip line, a radial stub, and/or a filter integrated stub.

In those or other scenarios, the methods further comprise allowing the Tx SOI signal to pass through a second junction of the communication path to which a second reflective frequency selective limiter is coupled. The first and second reflective frequency selective limiters may have a parallel arrangement and/or located adjacent to each other in the communication path of the communication device. The communication path may be defined by a transceiver chain. The first junction may be located prior to a given electronic device in the transceiver chain of the communication device and the second junction may be located subsequent to the given electronic device in the transceiver chain.

The implementing system and device can comprise a processor and/or a non-transitory computer-readable storage medium comprising programming instructions that are configured to cause the processor to implement a method for mitigating interference. Alternatively or additionally, the implementing system and/or device may include logic circuits (e.g., subtractors, adders, multipliers, etc.), passive circuit components (e.g., resistors, capacitors, switches, delays, etc.) and/or other active circuit components (e.g., transistors, demodulators, modulators, combiners, etc.).

The present document also concerns a transmitter. The transmitter comprises: a plurality of electronic devices configured to facilitate communication of a signal over a communication link; and at least a first reflective frequency selective limiter coupled to at least one of the electronic devices via a junction along a transmission line through which a transmit signal passes during operation of the transmitter. The first reflective frequency selective limiter is configured to (i) attenuate first unwanted components of the signal and (ii) reflect remaining components of the Tx SOI signal so that the remaining components travel downstream along the transmission line.

The first reflective frequency selective limiter can have a short circuit termination or an open circuit termination. Specified electrical lengths of transmission lines between junction points and short circuit and/or open circuit reflections points are to be understood as design targets. In some scenarios, electrical length targets are intentionally modified by up to 50% to account for practical manufacturing tolerances and/or available design materials. Both the short circuit and open circuit terminations can include, but are not limited to, an open wire, a microstrip, a waveguide, a strip line, a radial stub, and/or a filter integrated stub.

In some scenarios, the transmitter also comprises a second reflective frequency selective limiter coupled to a second junction of the transmission line through which the transmit signal passes. The first and second reflective frequency selective limiters may have a parallel arrangement and/or be located adjacent to each other along the transmission line. The first reflective frequency selective limiter may be located after a first electronic device of the plurality of electronic devices, and the second reflective frequency selective limiter may be located after a second electronic device of the plurality of electronic devices.

In some scenarios, the transmitter also comprises a multiplicity of reflective frequency selective limiters each coupled to a singular junction of the transmission line through which the transmit signal passes. Each reflective frequency selective limiter may have a parallel arrangement and/or be located adjacent to each other along the transmission line. Each reflective frequency selective limiter may be located after any of the plurality of electronic devices in the transmitter.

BRIEF DESCRIPTION OF THE DRAWINGS

This disclosure is facilitated by reference to the following drawing figures, in which like numerals represent like items throughout the figures.

DETAILED DESCRIPTION

Figure 1:
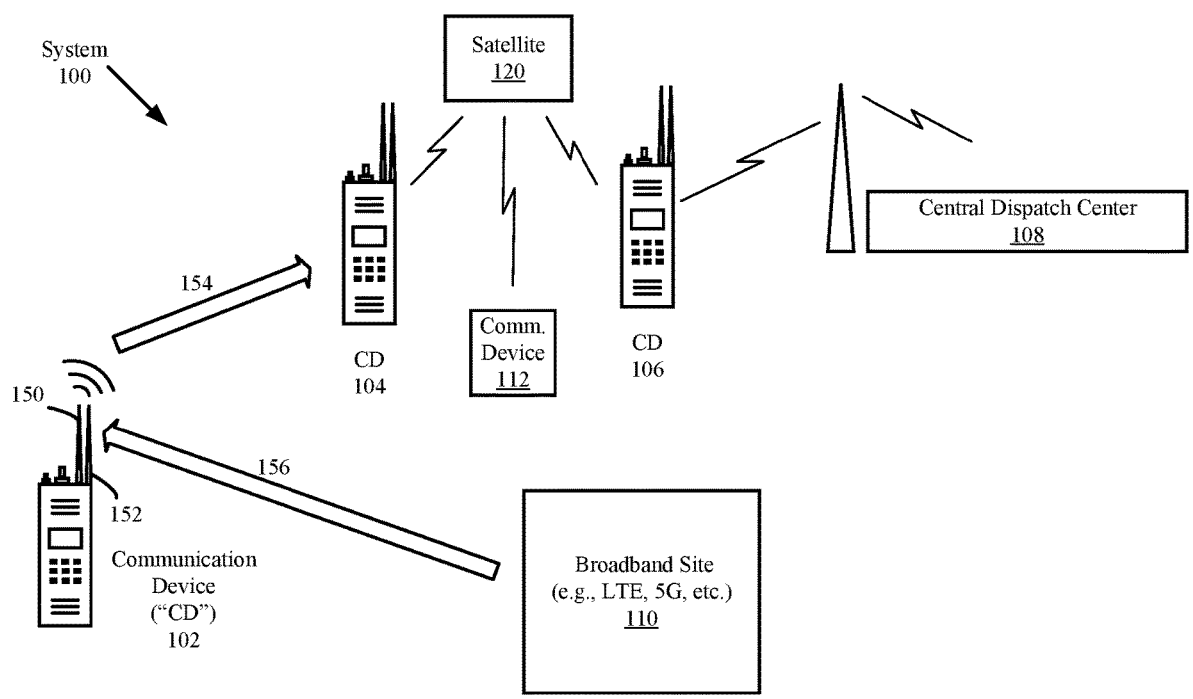
FIG. 1 provides an illustration of a system implementing the present solution.

It will be readily understood that the solution described herein and illustrated in the appended figures could involve a wide variety of different configurations. Thus, the following more detailed description, as represented in the figures, is not intended to limit the scope of the present disclosure, but is merely representative of certain implementations in various different scenarios. While the various aspects are presented in the drawings, the drawings are not necessarily drawn to scale unless specifically indicated.

Reference throughout this specification to features, advantages, or similar language does not imply that all of the features and advantages that may be realized should be or are in any single embodiment of the invention. Rather, language referring to the features and advantages is understood to mean that a specific feature, advantage, or characteristic described in connection with an embodiment is included in at least one embodiment of the present invention.

Thus, discussions of the features and advantages, and similar language, throughout the specification may, but do not necessarily, refer to the same embodiment.

In radio applications, co-site performance is a significant concern to operators. This is especially true for multichannel radios which have two or more closely spaced antennas. Transmitting on a first communication channel (e.g., RT1) via a first transceiver typically impacts reception of a Receive Signal-Of-Interest (Rx SOI) on the adjacent second channel's (e.g., RT2) communication link via a second transceiver, and vice versa. This may be caused by the transmit noise floor on the first communication channel which degrades the Signal-to-Noise-Ratio (SNR) of the second communication channel's Rx SOI. Therefore, large frequency gaps or excessive filtering are required between the first and second communication channels to achieve desired performance. These large frequency gaps limit the useable capabilities of the multichannel radio.

Current systems address this limitation by using (i) fixed frequency filters (bandpass and lowpass), (ii) high insertion loss tunable filters, (iii) increased spatial frequency planning, (iv) spatial diversity between antennas of the radio channels, and/or (v) time diversity (TDD) and code diversity (CDD). However, these conventional solutions also have drawbacks. For example, solutions (i) and (ii) impact the communications range of devices and increases the power required to transmit signals. Solution (iii) generally involves selecting the frequencies for the first and second communication channels to be separated by a relatively large amount from each other so that the transmitter's signal filtering at these frequencies is more effective. This frequency separation limits radio capabilities because only a portion (e.g., half) of its range (e.g., 30 MHz-6 GHz) can be used. Solution (iv) involves increasing the physical spacing between the antennas. However, this solution is only applicable to fixed infrastructures (and not to dismount architectures such as mobile radios which require a relatively small form factor). Solution (v) with TDD involves dividing the data transmission time down to allow discrete transmit and receive communication periods in a serial manner, decreasing the overall data throughput. And for CDD, system complexity and cost is increased to generate waveform encoding and decoding decrease receiver sensitivity to transmit noise. Thus, the present solution has been derived to provide an alternative approach to Rx SOI signal degradation in multichannel communication device applications.

The present solution provides implementing systems and methods for co-site performance of a multichannel communication devices. The methods comprise: obtaining an Rx SOI signal by the communication device; allowing the transmit signal to pass through a first junction of a communication path to which a first reflective frequency selective limiter is coupled; attenuating first unwanted components of the signal using the first reflective frequency selective limiter; and reflecting remaining Tx SOI components of the signal by the first reflective frequency selective limiter so that the remaining Tx SOI components travel downstream along the communication path.

In some scenarios, the methods also comprise creating a short circuit termination or an open circuit termination for the first reflective frequency selective limiter to facilitate the attenuation of the first unwanted components of the signal. An electrical length between the first junction and the short circuit termination may be equal to 180° plus n multiplied by 180°. In contrast, the electrical length between the first junction and the open circuit termination may be equal to 90° plus n multiplied by 180°. n is an integer equal to or greater than zero. Both the short circuit and open circuit terminations can include, but are not limited to, an open wire, a microstrip, a waveguide, a strip line, a radial stub, and/or a filter integrated stub.

In some scenarios, the methods also comprise creating a short circuit reflection or an open circuit reflection for the first reflective frequency selective limiter to facilitate the reflection of the first Tx SOI signal to travel unaltered downstream along the communication path. An electrical length between the first junction and the short circuit reflection may be equal to 90° plus n multiplied by 180°. In contrast, the electrical length between the first junction and the open circuit reflection may be equal to 0° plus n multiplied by 180°. n is an integer equal to or greater than zero. Both the short circuit and open circuit reflections can include, but are not limited to, an open wire, a microstrip, a waveguide, a strip line, a radial stub, and/or a filter integrated stub.

In those or other scenarios, the methods further comprise allowing the transmit signal to pass through a second junction of the communication path to which a second reflective frequency selective limiter is coupled. The first and second reflective frequency selective limiters may have a parallel arrangement and/or located adjacent to each other in the communication path of the communication device. The communication path may be defined by a transceiver chain. The first junction may be located prior to a given electronic device in the transceiver chain of the communication device and the second junction may be located subsequent to the given electronic device in the transceiver chain.

Referring now to FIG. 1, there is provided an illustration of a system 100 implementing the present solution. System 100 comprises a plurality of communication devices 102, 104, 106, a Central Dispatch Center (CDC) 108, a broadband site 110, and satellites 120, 112. The communication devices 102-106 are configured to facilitate communications on a plurality of channels (e.g., and RT1 channel and an RT2 channel). The communication devices 102-106 include, but are not limited to, portable radio(s), fixed radio(s) with static location(s), smart phone(s), ground station(s), and/or base station(s). The broadband site 110 includes, but is not limited to, an LMR site, a 2G cellular site, a 3G cellular site, a 4G cellular site, and/or a 5G cellular site. CDC 108 and broadband site 110 are well known in the art.

During operation of system 100, the signals being transmitted from communication device(s) 102-112, 120 on a first channel (e.g., RT1) need processing in accordance with the present solution to reduce or eliminate any impact thereof to signal reception on an adjacent channel's communication link (e.g., RT2 communication links). For example, a first signal 154 is transmitted from the communication device 102 over a first communication link using a first antenna 150, while a second signal 156 is being received by the same communication device 102 using a second antenna 152 which is co-located with the first antenna 150. The first signal's transmission can impact the communication device's reception of the second signal 156. In order to eliminate or reduce this impact, the communication device 102 has one or more reflective Frequency Selective Limiters (FSLs) in a transceiver chain (e.g., a transmit path and/or a receive path). Each reflective FSL is generally configured to create a RF power activated bandpass filter (or adaptive frequency spurious suppressor) which reduces the level of spurious components adjacent to the transmit signal of interest (Tx SOI). The spurious components of a signal are also referred to herein as unwanted signal components, and the remaining components of the signal are referred to herein as Tx SOI signal components. The spurious or unwanted signal components can include, but are not limited to, transmit noise (e.g., due to transmit chain gain at non-transmit signal frequencies), transmit harmonics and/or transmit spurious signals caused by the transmit chain (e.g., local oscillator, intermodulation distortion, power supply noise, etc.). The Tx SOI signal components can include, but are not limited to, command data, control data, user data, and/or radar signals.

In some scenarios, each reflective FSL uses non-linear excitation of magnetic spin waves in an appropriately magnetized ferrite such as Yttrium-Iron-Garnet (YIG). Microwave signals coupled to a sample of YIG produce an essentially linear, low-loss response in the ferrite at low signal levels. Above a critical RF magnetic field strength, the reflective FSL becomes non-linear and attenuates all frequencies above the threshold. The present solution is not limited to the type of reflective FSL. Other types of reflective FSLs can be used here. Each reflective FSL generally creates a band pass adaptive frequency spurious suppressor. The band pass adaptive frequency spurious suppressor significantly attenuates spurious components (e.g., transmit noise) in a signal and/or significantly improves co-site capabilities of adjacent channels without impacting the first communication channel's transmit and receive performance.

Figure 2:
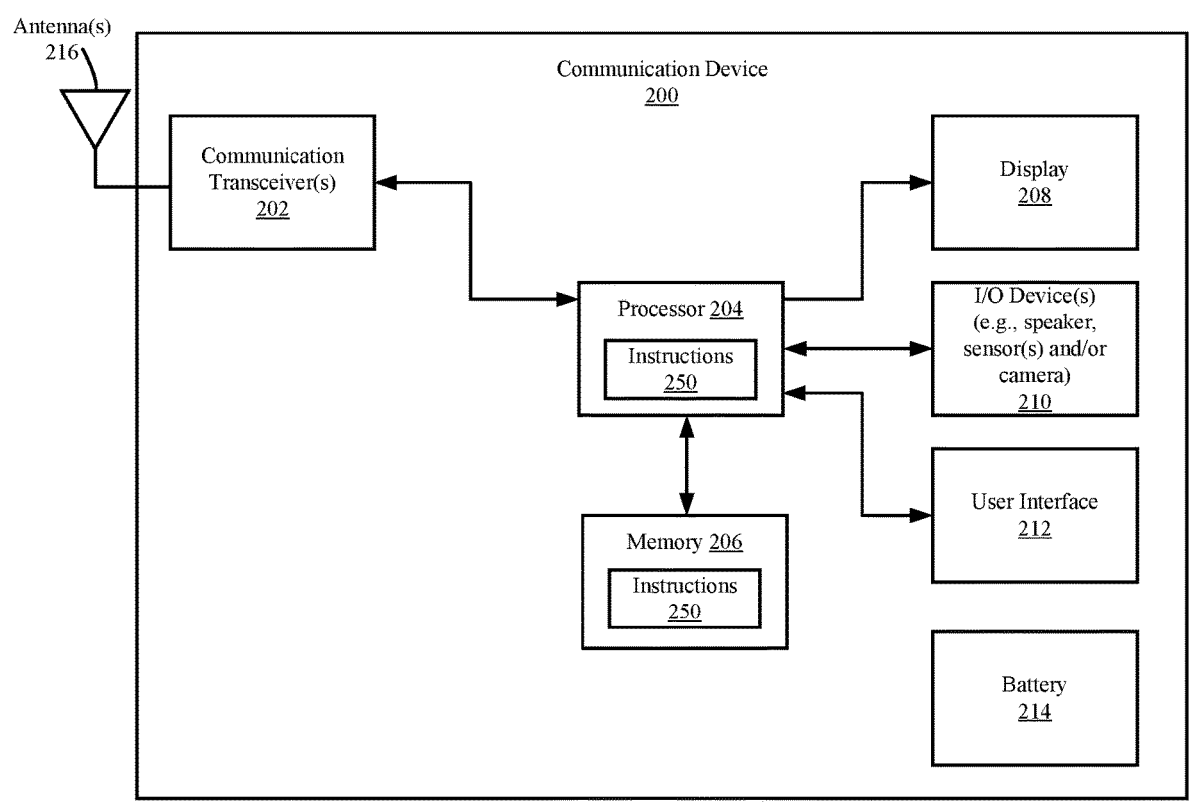
FIG. 2 provides an illustration of a communication device architecture.

Referring now to FIG. 2, there is provided an illustration of an illustrative architecture for a communication device 200 which is configured for carrying out the various methods described herein. Communication devices 102-112, 120 of FIG. 1 are the same as or similar to communication device 200. As such, the discussion provided below in relation to communication device 200 is sufficient for understanding communication devices 102-112, 120 of FIG. 1. Communication device 200 can include more or less components than that shown in FIG. 2 in accordance with a given application. For example, communication device 200 can include one or both components 208 and 210. The present solution is not limited in this regard.

As shown in FIG. 2, the communication device 200 comprises a communication transceiver 202 coupled to an antenna 216. The communication transceiver can comprise one or more components such as a processor, an application specific circuit, a programmable logic device, a digital signal processor, or other circuit programmed to perform the functions described herein. The communication transceiver 202 can enable end-to-end communication services in a manner known in the art. In this regard, the communication transceiver can facilitate communication of data (e.g., voice data and/or media content) from the communication device 200 over a network and/or communications channel (e.g., a satellite communication channel).

The communication transceiver 202 can include, but is not limited to, a radio transceiver, a satellite transceiver, and/or a cellular network communication transceiver. The communication transceiver 202 is connected to a processor 204 comprising an electronic circuit. During operation, the processor 204 is configured to control the communication transceiver 202 for providing communication services. The processor 204 also facilitates transmit spurious component suppression. The manner in which the processor facilitates transmit spurious component suppression will become evident as the discussion progresses.

A memory 206, display 208, user interface 212 and Input/Output (I/O) device(s) 210 are also connected to the processor 204. The processor 204 may be configured to collect and store data generated by the I/O device(s) 210 and/or external devices (not shown). The I/O device(s) 210 can include, but are not limited to, a speaker, a microphone, sensor(s) (e.g., a temperature sensor and/or a humidity sensor), and/or a camera. Data stored in memory 206 can include, but is not limited to, one or more look-up tables or databases which facilitate selection of communication groups or specific communication device. The user interface 212 includes, but is not limited to, a plurality of user depressible buttons that may be used, for example, for entering numerical inputs and selecting various functions of the communication device 200. This portion of the user interface may be configured as a keypad. Additional control buttons and/or rotatable knobs may also be provided with the user interface 212. A battery 214 or other power source may be provided for powering the components of the communication device 200. The battery 200 may comprise a rechargeable and/or replaceable battery. Batteries are well known in the art, and therefore will not be discussed here.

The communication device architecture shown in FIG. 2 should be understood to be one possible example of a communication device system which can be used in connection with the various implementations disclosed herein. However, the systems and methods disclosed herein are not limited in this regard and any other suitable communication device system architecture can also be used without limitation. Applications that can include the apparatus and systems broadly include a variety of electronic and computer systems. In some scenarios, certain functions can be implemented in two or more specific interconnected hardware modules or devices with related control and data signals communicated between and through the modules, or as portions of an application-specific integrated circuit. Thus, the illustrative system is applicable to software, firmware, and hardware implementations.

Figure 3:
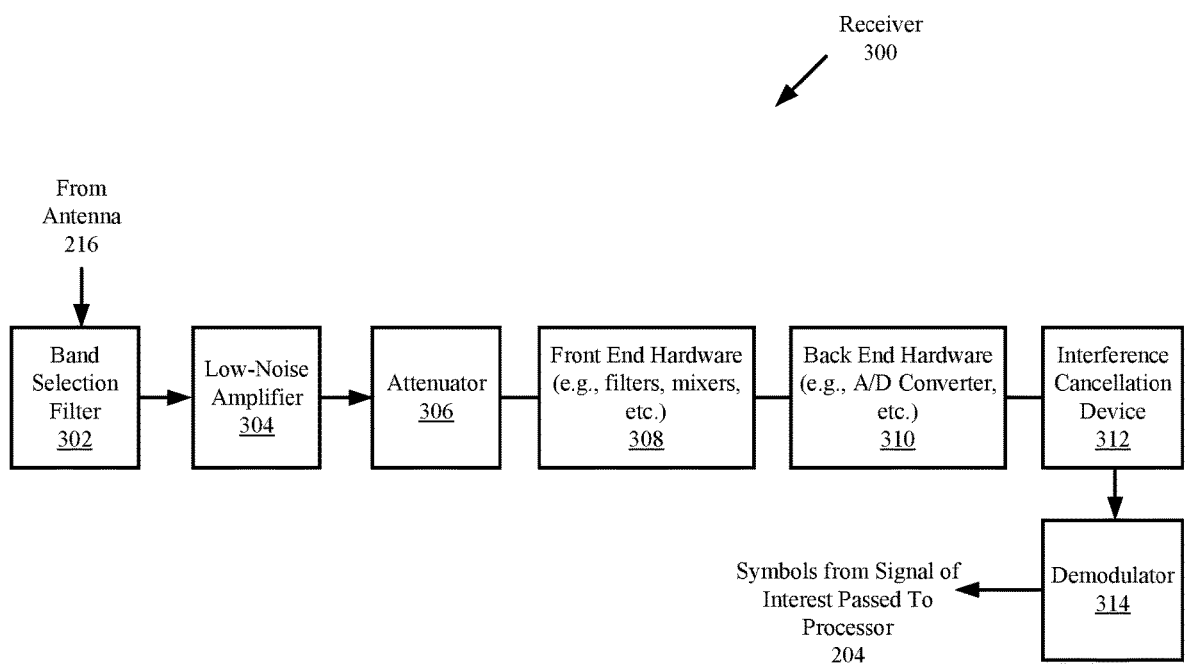
FIG. 3 provides an illustration of a receiver architecture.

Referring now to FIG. 3, there is provided a more detailed illustration of a receiver portion 300 of the communication transceiver 202. Receiver 300 comprises a band selection filter 302, a Low-Noise Amplifier (LNA) 304, an attenuator 306, front end hardware 308, backend hardware 310, an interference cancellation device 312, and a demodulator 314. Each of the listed devices 302-314 is known in the art, and therefore will not be described herein. In some scenarios, the attenuator 306 comprises reflective FSL(s). The input to the receiver portion 300 comprises an SOI transmitted from another communication device along with interfering signal(s). The output of the receiver portion 300 is passed to processor 204. The output comprises symbols from the SOI.

Figure 4:
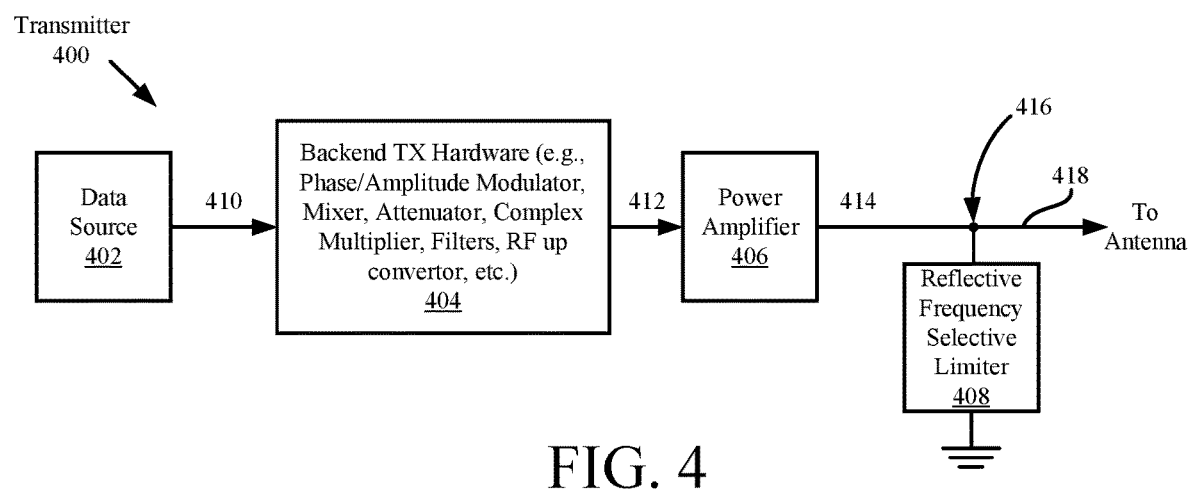
FIG. 4 provides an illustration of a transceiver architecture.

Referring now to FIG. 4, there is provided a more detailed illustration of a transmitter portion 400 of the communication transceiver 202. The transmitter 400 generally implements transmit spurious component suppression using reflective FSL(s) in the signal transmit path thereof. The transmitter 400 comprises a data source 402, backend TX hardware 404, a power amplifier 406 and a reflective FSL 408. The transmitter 400 can include more or less components than that shown. For example, filters can be disposed between the power amplifier 406 and junction 416 and/or between junction 416 and the antenna.

During operation, the data source 402 supplies data 410 to the backend TX hardware 404. The data 410 includes, but is not limited to, command data, control data and/or user data. At the backend TX hardware 404 operations may optionally be performed to generate a data signal to be transmitted from the communication device. These operations can optionally include frequency hopping, frequency conversion, and/or spreading an amplitude-and-time-discrete baseband signal over a wide intermediate frequency band. This spreading generally consists of multiplying the amplitude-and-time-discrete baseband signal by a spreading sequence. As such, the backend TX hardware 404 may include, but is not limited to, phase modulator(s), amplitude modulator(s), mixer(s), attenuator(s), source encoder(s), symbol formatter(s), multiplexer(s), channel encoder(s), complex multiplier(s), interpolator(s), Digital-to-Analog convertors (DACs), filter(s), amplifier(s), Local Oscillators (LOs) and IF-to-RF convertor(s). Each of the listed types of backend TX hardware is well known in the art. The result of the operations performed by the backend TX hardware 404 is referred to herein as low power signal 412. The low power signal 412 is then passed to the power amplifier 406 where its power is increased. Thereafter, the high-power signal 414 is passed to the antenna for transmission over a communication link.

Figure 5:
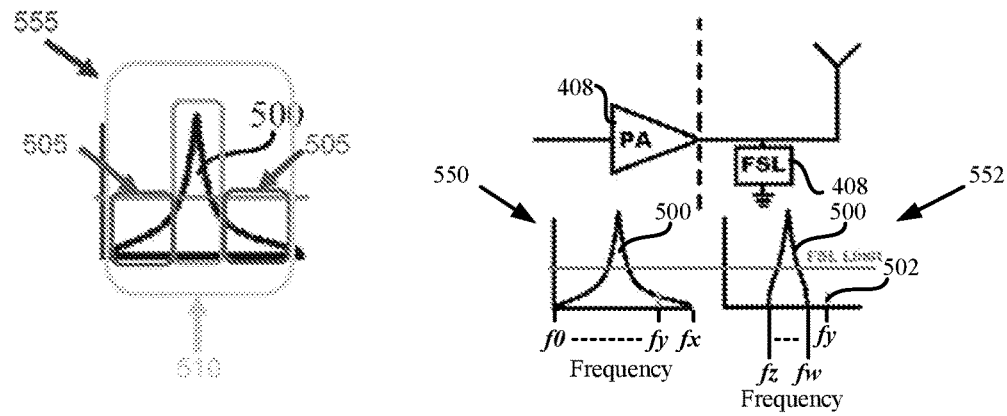
FIG. 5 provides an illustration that is useful for understanding operations of the present solution.

A graph 555 is provided in FIG. 5 that is useful for understanding the components of the signal 414. As shown in graph 555, signal 500 comprises the transmit signal of interest (Tx SOI). As shown in graph 555, signal 510 comprises the transmit signal which is a superset including but not limited to 500 and 505. As shown in graph 550, an example of signal 216 is shown without the benefit of including the Reflective Frequency Selective Limiter (FSL) at junction 416. The total signal content at 216 comprises but is not limited to transmit and receive signals present at the antenna. The transmit noise 500 is produced by the transceiver of the communication device. The range of frequencies for the transmit noise 500 is f0–fx. The frequency fy of the Rx SOI 502 falls within this range, which is why the transmit noise of a first communication channel can impact reception of the Rx SOI 502 on a second communication channel by the same communication device.

In order to reduce or eliminate this impact, a reflective FSL 408 is coupled to the transmission line 418 between the power amplifier 406 and antenna 216 at junction 416. The reflective FSL 408 is generally configured to suppress spurious components (e.g., transmit noise) of transmit signal 414 prior to transmission. This spurious component suppression by the reflective FSL 408 is achieved by virtually shorting the spurious spectral content at junction 416 so that the spurious spectral content does not propagate to the transmit antenna along transmission line 418. The virtual Short Circuit (SC) effect can be achieved by providing the reflective FSL 408 with a SC termination. The SC termination can be implemented by a ground connection as shown in FIGS. 4-5. The data component(s) of signal 414 is reflected by the reflective FSL 408 with a virtual Open Circuit (OC) at junction 416. This reflection causes the data component(s) to propagate downstream in the transmit chain.

A graph 552 is provided in FIG. 5 which is useful for understanding operations of the reflective FSL 408. As shown in graph 552, the observable frequency range of the transmit noise 500 has been reduced from f0–fx to fx–fw. The frequency fy of the Rx SOI 502 no longer falls within this range, and therefore any impact of the communication device's transmission of the high-power signal 414 to the communication device's reception of the SOI 502 is reduced or eliminated.

The present solution is not limited to the architecture shown in FIGS. 4-5. The reflective FSL(s) can be connected to the transceiver chain(s) in different ways and at different locations along the transceiver chains. Some alternative architectures are shown in FIGS. 6-10.

As noted above, the spurious component suppression by a reflective FSL is achieved by virtually shorting the transmit spurious component spectral content at a given junction so that the spurious component does not propagate downstream. The SC effect can be achieved by providing the FSL with an OC termination or an SC termination. The transmitter of FIG. 6 implements a shunt Tx FSL with an OC termination, while the transmitter of FIG. 7 implements a shunt Tx FSL with an SC termination.

Figure 6:
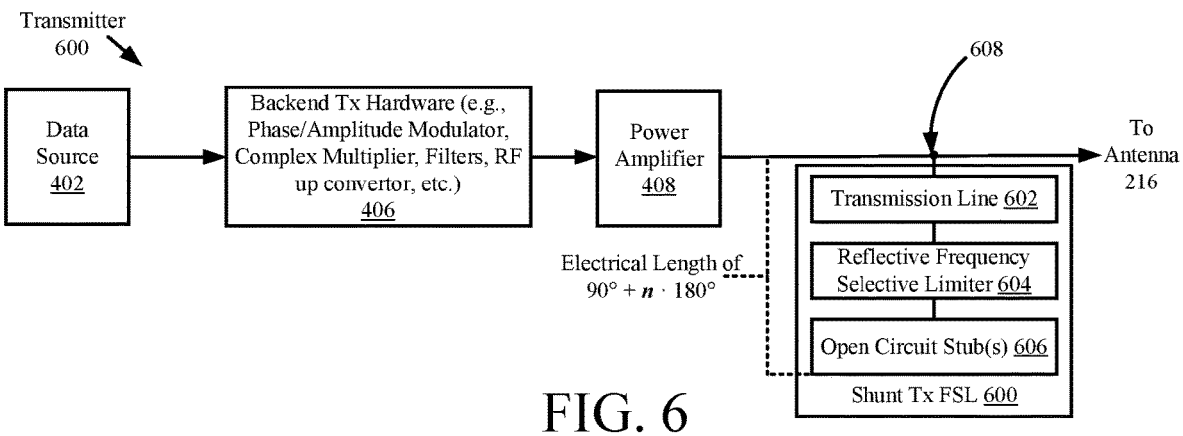
FIGS. 6-11 each provide another transceiver architecture.

Referring now to FIG. 6, there is provided an illustration of another architecture for a transmitter 600. Transmitter 600 comprises data source 402, backend Tx hardware 406, power amplifier 408 and a shunt Tx FSL 600 with an OC termination. The OC termination is implemented using OC stub(s) 606, which create(s) a virtual short circuit at junction 608 for spurious component suppression. The OC stub(s) 606 include(s) any means that terminates a transmission line in a fixed impedance. The OC stub(s) 606 can include, but is not limited to, open wire(s), microstrip(s), waveguide(s), strip line(s), radial stub(s), and/or filter integrated stub(s). Each of the listed types of OC stubs is known. In some scenarios, a broadband technique is integrated in the OC stub 606 for increasing the performance thereof. The broadband technique can be implemented, for example, with a radial stub or by using two or more stubs in a parallel arrangement to create a filtering effect.

The electrical length from junction 602 to the end of OC stub 606 is 90° plus n multiplied by 180°, where n is an integer equal to or greater than zero. The transmission line 602 is configured to facilitate provision of an electrical length from junction 608 to the end of OC stub 606 in accordance with any given application. The transmission line 602 can include any signal carrying transmission line (e.g., a microstrip, a strip line and/or a waveguide). The electrical length can be selected to ensure that (i) the OC reflection of the reflective FSL 604 will not create out-of-phase destructive cancellation and degrade the intended transmit signal propagation downstream, and (ii) suppression of the spurious components by the reflective FSL 604 is optimized.

Figure 7:
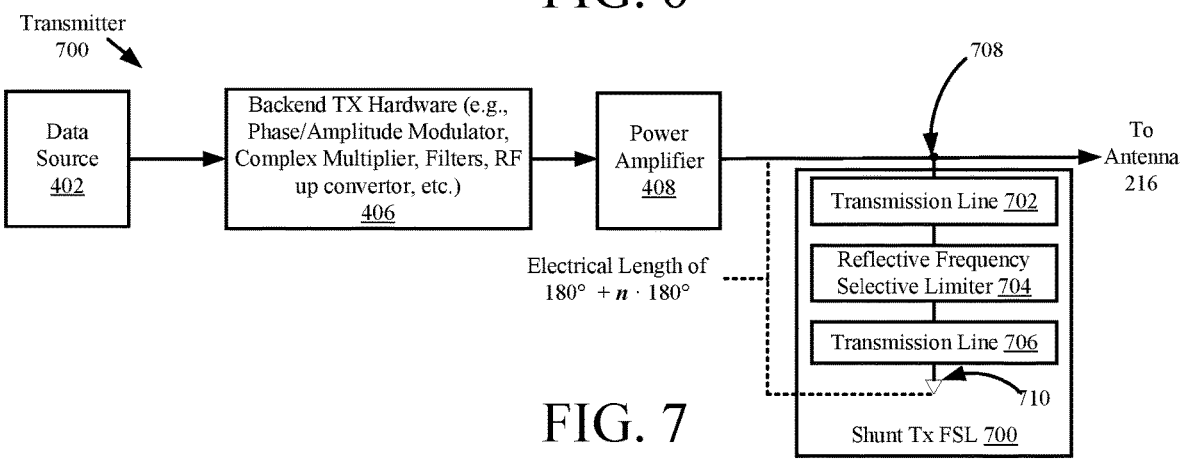

Referring now to FIG. 7, there is provided an illustration of another architecture for a transmitter 700. Transmitter 700 comprises data source 402, backend Tx hardware 406, power amplifier 408 and a shunt Tx FSL 700 with an SC termination. The SC termination is implemented using a ground connection 710, which creates a virtual short circuit at junction 708 for spurious component suppression.

The electrical length from junction 708 to the SC termination 710 is 180° plus n multiplied by 180°, where n is an integer equal to or greater than zero. The transmission line 702 is configured to facilitate provision of an electrical length from junction 708 to the end of the SC termination 710 in accordance with any given application. The transmission line 702 can include any signal carrying transmission line (e.g., a microstrip, a strip line and/or a waveguide). The electrical length can be selected to ensure that (i) the SC reflection of the reflective FSL 704 will not terminate the transmit signal and (ii) suppression of the spurious components by the reflective FSL 704 is optimized. In some scenarios, a broadband technique is integrated with the SC termination 710 for increasing the performance thereof. The broadband technique can include, but is not limited to, filters.

Figure 14:
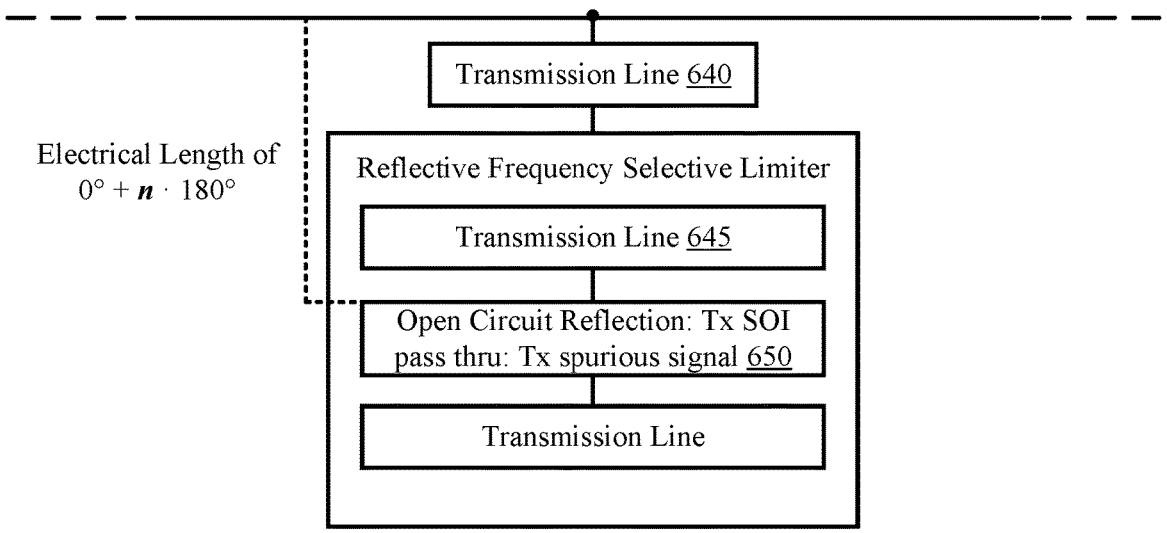
FIGS. 14-15 each provide an illustration of another architecture for a reflective frequency selective limiter.

Referring now to FIG. 14, there is provided an illustration of another architecture for a Reflective Frequency Selective Limiter 604 or 704. Reflective Frequency Selective Limiter 604 and/or 704 creates a reflection of the Tx SOI signal, which creates a virtual OC for Tx SOI at junction 608 or 708. As shown in FIG. 14, Reflection of the Tx SOI created at 604 or 704 is implemented using a virtual OC 650.

The electrical length from junction 608 or 708 to the OC reflection 650 is 0° plus n multiplied by 180°, where n is an integer equal to or greater than zero. The transmission line 640 plus 645 is configured to facilitate provision of an electrical length from junction 608 or 708 to the OC reflection 650 in accordance with any given application. The transmission lines 640 and 645 can include any signal carrying transmission line (e.g., a microstrip, a strip line and/or a waveguide). The electrical length can be selected to ensure that the OC reflection of the reflective FSL 650 will create a virtual Open Circuit for the Tx SOI at junction 608 or 708, which causes the Tx SOI to propagate downstream unaltered. Transmission Line 640 can represent 602 or 702, comprising the signal path connection between junction 608 and FSL 604 or connection between 708 and 704. Transmission Line 645 comprise the signal path from the input of the FSL component 604 or 704 and the OC reflection 650.

Figure 15:
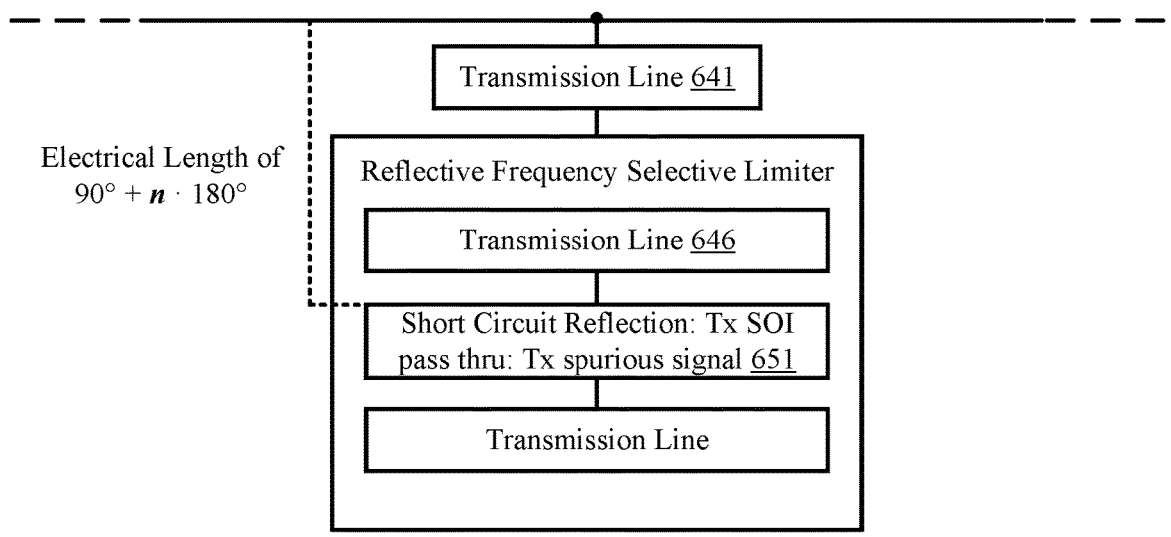

Referring now to FIG. 15, there is provided an illustration of another architecture for a Reflective Frequency Selective Limiter 604 or 704. Reflective Frequency Selective Limiter 604 and/or 704 creates a reflection of the Tx SOI signal, which creates a virtual OC for Tx SOI at junction 608 or 708. As shown in FIG. 14, Reflection of the Tx SOI created at 604 or 704 is implemented using a virtual SC 651.

The electrical length from junction 608 or 708 to the SC reflection 651 is 90° plus n multiplied by 180°, where n is an integer equal to or greater than zero. The transmission line 641 plus 646 is configured to facilitate provision of an electrical length from junction 608 or 708 to the SC reflection 651 in accordance with any given application. The transmission lines 641 and 646 can include any signal carrying transmission line (e.g., a microstrip, a strip line and/or a waveguide). The electrical length can be selected to ensure that the SC reflection of the reflective FSL 651 will create a virtual Open Circuit for the Tx SOI at junction 608 or 708, which causes the Tx SOI to propagate downstream unaltered. Transmission Line 641 can represent 602 or 702, comprising the signal path connection between junction 608 and FSL 604 or connection between 708 and 704. Transmission Line 646 comprise the signal path from the input of the FSL component 604 or 704 and the SC reflection 651.

Figure 8:
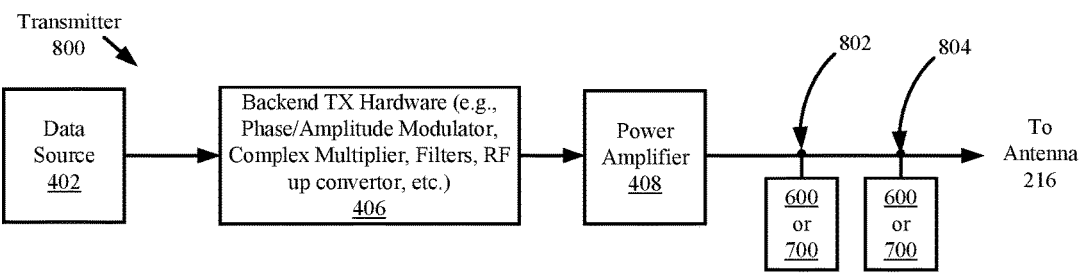
Figure 9:
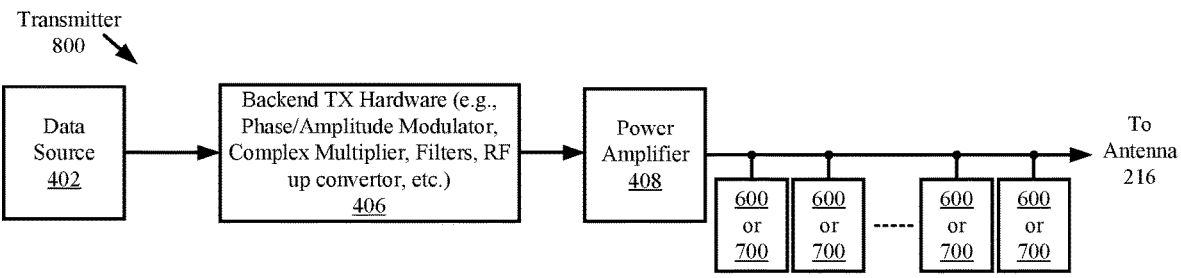

Referring now to FIG. 8, there is provided an illustration of another architecture for a transmitter 800. Transmitter 800 comprises data source 402, backend Tx hardware 406, power amplifier 408 and a two shunt Tx FLSs. The shunt Tx FLSs can include, two shunt Tx FSLs 600, two shunt Tx FSLs 700, or a combination of shunt FSLs 600, 700. The Tx FSLs have a parallel arrangement.

Figure 10:
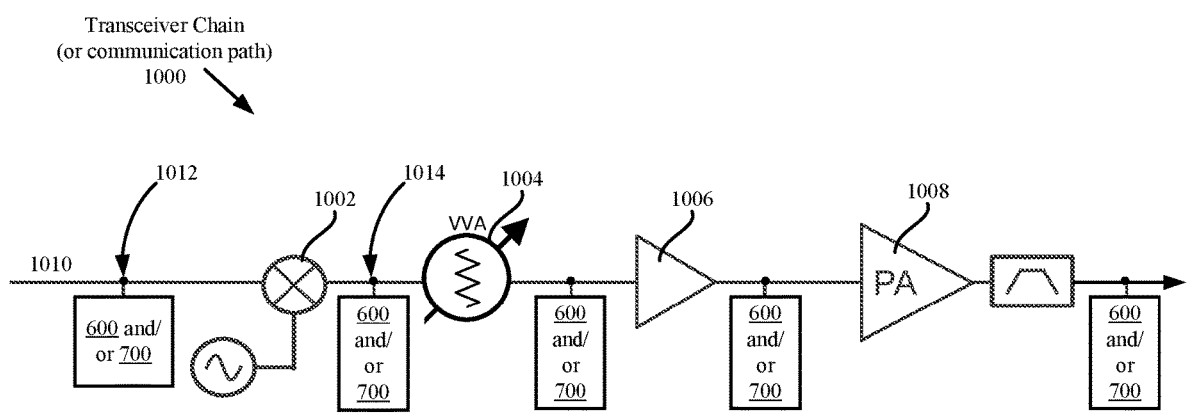

Notably, shunt Tx FSL(s) can be placed at other locations along a transceiver chain than those shown in FIGS. 4-9. The shunt Tx FLS(s) can be placed at any location along a transceiver chain where filtering of spurious content is beneficial (e.g., where there is a differentiation between the frequency of the Tx SOI and the frequency of the spurious content). For example, as shown in FIG. 10, a plurality of shunt FSLs are disposed along a transceiver chain 1000. The transceiver chain 1000 can include a transmit path or a receive path. Each shunt FSL block of FIG. 10 can include shunt FSL 600 of FIG. 6 and/or shunt FSL 700 of FIG. 7. In FIG. 10, shunt FSL(s) is(are) disposed prior to a mixer 1002, a Voltage Variable Attenuator (VVA), a driver amplifier 1006 and a power amplifier 1008. Shunt FSL(s) is(are) also disposed after the power amplifier 1008. The present solution is not limited to the particular locations for the FSLs as shown in FIG. 10. FSL(s) can be placed at other location in a transceiver chain.

Figure 11:
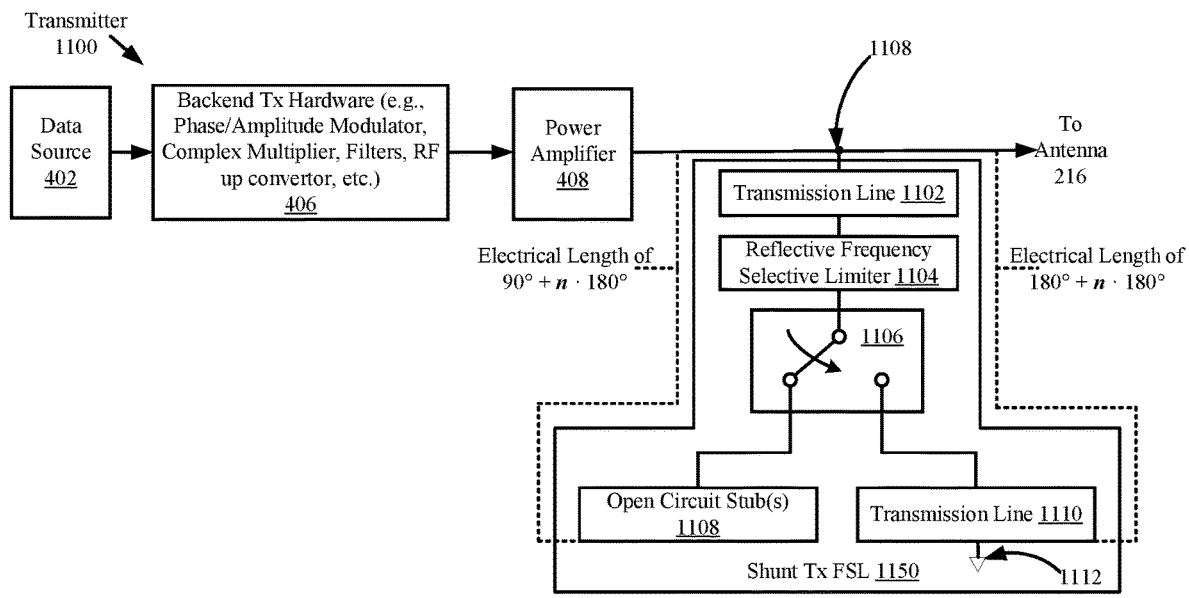

Referring now to FIG. 11, there is provided an illustration of another architecture for a transmitter 1100. Transmitter 1100 comprises data source 402, backend Tx hardware 406, power amplifier 408 and a shunt Tx FLS 1150. The shunt Tx FLS 1150 comprises a switch 1106 with two or more positions. Switch 1106 is provided to facilitate the shunt Tx FLS's transition between operating modes. The switch 1106 may be controlled by a processor (e.g., processor 204 of FIG. 2). The position of the switch 1106 can be controlled to optimize performance of transmitter 1100 based on the functional bandwidth of the terminations and the transmit frequency.

The operating modes include an OC termination mode and a SC termination mode. In the OC termination mode, the shunt Tx FLS has an architecture that is the same as or similar to FSL 600 of FIG. 6. As such, the shunt Tx FLS comprises a transmission line 1102, a reflective frequency selective limiter 1104 and an open circuit stub(s) 1108 which are respectively the same as or similar to components 602, 604, 606 of FIG. 6. In the SC termination mode, the shunt Tx FLS comprise transmission lines 1102, 1110, a reflective frequency selective limiter 1104, and a ground connection 1112 which are respectively the same as or similar to components 702, 704, 706, 710 of FIG. 7.

The present solution is not limited to the architecture of FIG. 11. The switch 1106 can have any number of positions selected in accordance with a given application. Also, the shunt Tx FLS 1150 can have two or more OC termination modes, two or more SC termination modes, and/or a combination of any number of OC termination modes and/or any number of SC termination modes. In this regard, it should be noted that the shunt Tx FLS can comprise only OC termination modes, only SC termination modes, or any combination of OC and SC termination modes.

Figure 12:
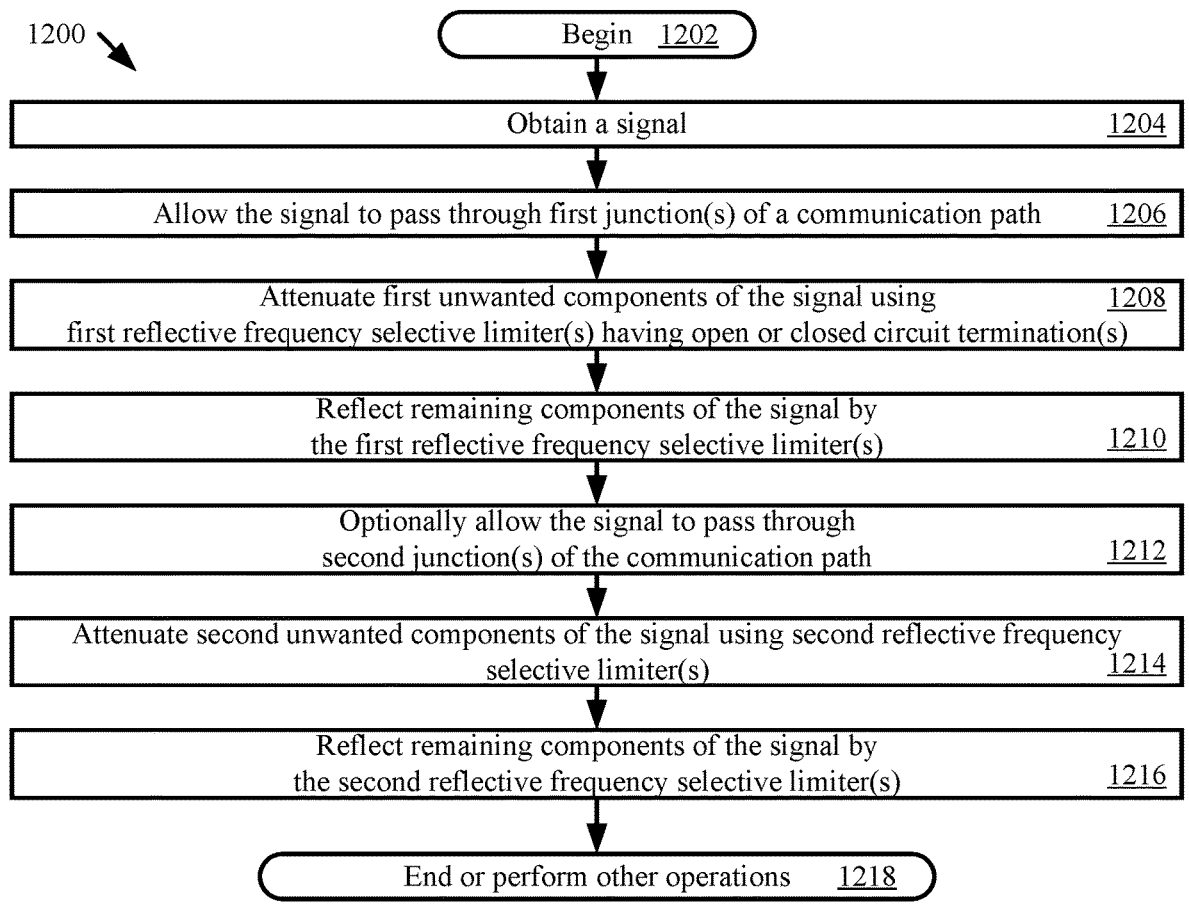
FIG. 12 provide flow diagrams of an illustrative method for mitigating interference.

Referring now to FIG. 12, there is provided a method 1200 for operating a communication device. Method 1200 implements the spurious component suppression process described above. Method 1200 begins with 1202 and continues with 1204 where a signal (e.g., signal 414 of FIG. 4 or 1010 of FIG. 10) is obtained. The signal is allowed to pass through first junction(s) (e.g., junction 416 of FIG. 4, junction 802 of FIG. 8, or 1012 of FIG. 10) of a communication path (e.g., communication path 1000 of FIG. 10). First reflective FSL(s) (e.g., reflective FSL 408 of FIG. 4, reflective FSL 600 of FIG. 6, or reflective FSL 700 of FIG. 7) is(are) coupled to the first junction(s).

Next in 1208, first unwanted components of the signal are attenuated using the first reflective FSL(s). The attenuation is facilitated by: (i) short circuit termination(s) created for the first reflective FSL(s); or (ii) open circuit termination(s) created for the first reflective FSL(s). An electrical length is (a) provided between the junction(s) and the short circuit termination(s) equal to 180° plus n multiplied by 180°, or (b) provided between the junction(s) and the open circuit termination(s) equal to 90° plus n multiplied by 180°. n is an integer equal to or greater than zero. The open circuit termination(s) can include, but are not limited to, open wires(s), microstrip(s), waveguide(s), strip line(s), radial stub(s), and/or filter integrated stub(s). The remaining components of the signal are reflected in 1210 by the first FSL(s). In effect, the remaining components travel downstream along the communication path.

In optional 1212, the signal is allowed to pass through second junction(s) (e.g., junction 804 of FIG. 8 or junction 1014 of FIG. 10) of the communication path. Second reflective FSL(s) (e.g., FSL 408 of FIG. 4, FSL 600 of FIG. 6, FSL 700 or of FIG. 7) is(are) coupled to the second junction(s). The first and second reflective FSLs may have a parallel arrangement and/or be located adjacent to each other in the communication path. The communication path may be defined by a transceiver chain of a communication device (e.g., communication device 102-112 or 120 of FIG. 1). As shown by 1214 and 1216, the second reflective FSL(s) attenuation second unwanted components of the signal and reflect the remaining components of the signal. The reflective remaining components of the signal travel downstream in the communication path (e.g., towards an antenna). Subsequently, method 1200 ends or other operations are performed (e.g., return to 1204).

Figure 13:
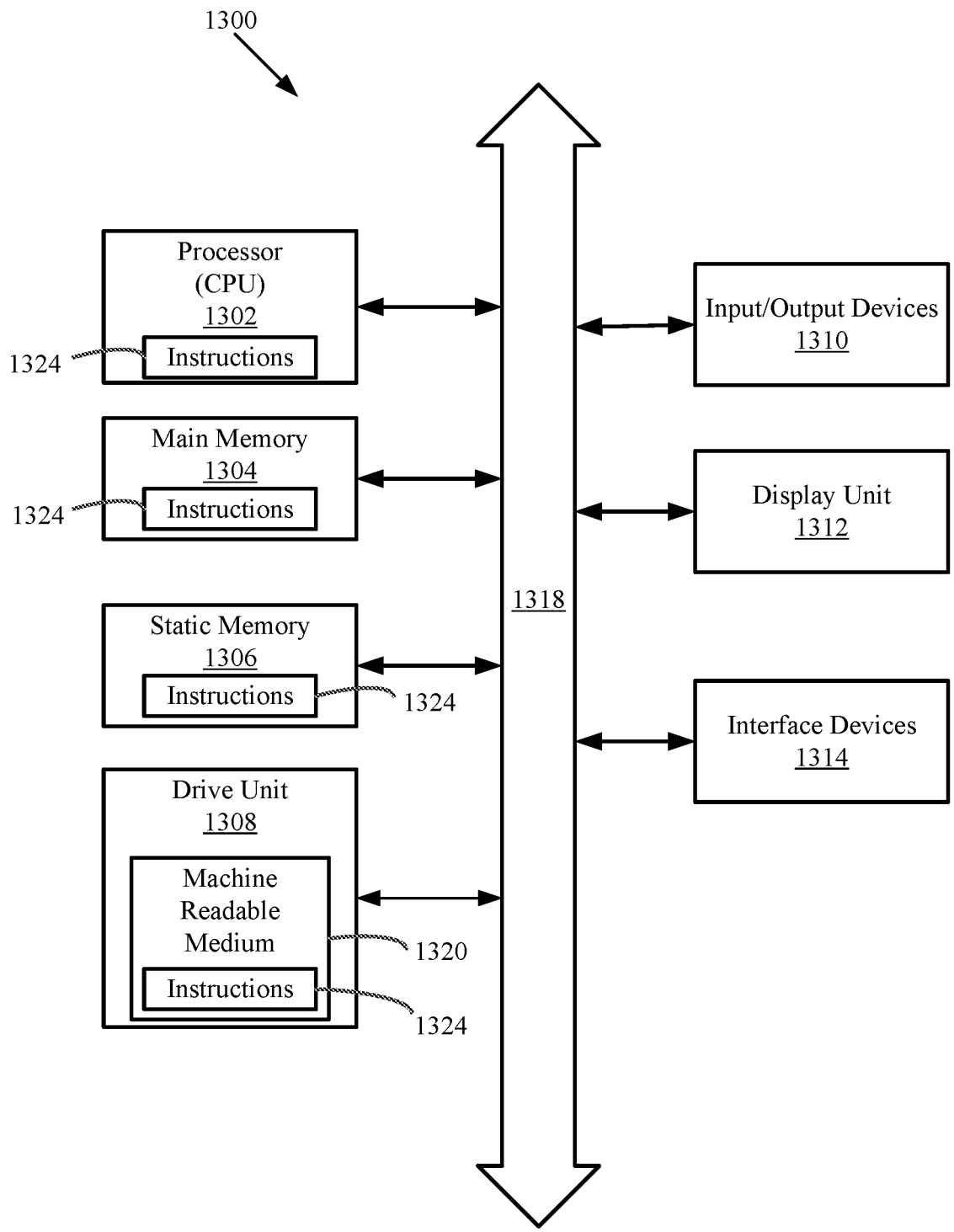
FIG. 13 provides an illustration of an architecture for a computing device.

Referring now to FIG. 13, there is shown a hardware block diagram comprising an example computer system 1300 that can be used for implementing all or part of the communication device 200 of FIG. 2. The machine can include a set of instructions which are used to cause the circuit/computer system to perform any one or more of the methodologies discussed herein. While only a single machine is illustrated in FIG. 13, it should be understood that in other scenarios the system can be taken to involve any collection of machines that individually or jointly execute one or more sets of instructions as described herein.

The computer system 1300 is comprised of a processor 1302 (e.g., a Central Processing Unit (CPU)), a main memory 1304, a static memory 1306, a drive unit 1308 for mass data storage and comprised of machine readable media 1320, input/output devices 1310, a display unit 1312 (e.g., a Liquid Crystal Display (LCD) or a solid state display, and one or more interface devices 1314. Communications among these various components can be facilitated by means of a data bus 1318. One or more sets of instructions 1324 can be stored completely or partially in one or more of the main memory 1304, static memory 1306, and drive unit 1308. The instructions can also reside within the processor 1302 during execution thereof by the computer system. The input/output devices 1310 can include a keyboard, a multi-touch surface (e.g. a touchscreen) and so on. The interface device(s) 1314 can be comprised of hardware components and software or firmware to facilitate an interface to external circuitry. For example, in some scenarios, the interface devices 1314 can include one or more Analog-to-Digital (A/D) converters, Digital-to-Analog (D/A) converters, input voltage buffers, output voltage buffers, voltage drivers and/or comparators. These components are wired to allow the computer system to interpret signal inputs received from external circuitry, and generate the necessary control signals for certain operations described herein.

The drive unit 1308 can comprise a machine readable medium 1320 on which is stored one or more sets of instructions 1324 (e.g. software) which are used to facilitate one or more of the methodologies and functions described herein. The term "machine-readable medium" shall be understood to include any tangible medium that is capable of storing instructions or data structures which facilitate any one or more of the methodologies of the present disclosure. Exemplary machine-readable media can include solid-state memories, Electrically Erasable Programmable Read-Only Memory (EEPROM) and flash memory devices. A tangible medium as described herein is one that is non-transitory insofar as it does not involve a propagating signal.

Computer system 1300 should be understood to be one possible example of a computer system which can be used in connection with the various implementations disclosed herein. However, the systems and methods disclosed herein are not limited in this regard and any other suitable computer system architecture can also be used without limitation. Dedicated hardware implementations including, but not limited to, application-specific integrated circuits, programmable logic arrays, and other hardware devices can likewise be constructed to implement the methods described herein. Applications that can include the apparatus and systems broadly include a variety of electronic and computer systems. Thus, the exemplary system is applicable to software, firmware, and hardware implementations.

Further, it should be understood that embodiments can take the form of a computer program product on a tangible computer-usable storage medium (for example, a hard disk or a CD-ROM). The computer-usable storage medium can have computer-usable program code embodied in the medium. The term computer program product, as used herein, refers to a device comprised of all the features enabling the implementation of the methods described herein. Computer program, software application, computer software routine, and/or other variants of these terms, in the present context, mean any expression, in any language, code, or notation, of a set of instructions intended to cause a system having an information processing capability to perform a particular function either directly or after either or both of the following: a) conversion to another language, code, or notation; or b) reproduction in a different material form.

The described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

We claim:

1. A method for operating a communication device, comprising:
   obtaining a signal by the communication device;
   allowing the signal to pass through a first junction of a transmit communication path, wherein a first reflective frequency selective limiter is coupled between the first junction and a short or open circuit termination and configured to provide frequency adaptive spurious signal suppression; and
   providing the frequency adaptive spurious signal suppression by attenuating first unwanted components of the signal using the first reflective frequency selective limiter; and
   reflecting remaining components of the signal by the first reflective frequency selective limiter so that the remaining components travel downstream along the communication path.

2. The method according to claim 1, further comprising creating a short circuit termination for the first reflective frequency selective limiter to facilitate the attenuation of the first unwanted components of the signal.

3. The method according to claim 2, further comprising providing an electrical length between the first junction and the short circuit termination equal to 180° plus n multiplied by 180°, where n is an integer equal to or greater than zero.

4. The method according to claim 1, further comprising creating an open circuit termination for the first reflective frequency selective limiter to facilitate the attenuation of the first unwanted components of the signal.

5. The method according to claim 4, further comprising providing an electrical length between the first junction and the open circuit termination equal to 90° plus n multiplied by 180°, where n is an integer equal to or greater than zero.

6. The method according to claim 4, wherein the open circuit termination comprises at least one of an open wire, a microstrip, a waveguide, a strip line, a radial stub, and a filter integrated stub.

7. The method according to claim 1, further comprising allowing the signal to pass through a second junction of the communication path to which a second reflective frequency selective limiter is coupled.

8. The method according to claim 7, wherein the first and second reflective frequency selective limiters have a parallel arrangement.

9. The method according to claim 7, wherein first and second junctions are located adjacent to each other in a transceiver chain of the communication device.

10. The method according to claim 7, wherein the first junction is located prior to a given electronic device in a transceiver chain of the communication device and the second junction is located subsequent to the given electronic device in the transceiver chain.

11. The method according to claim 1, further comprising creating a virtual open circuit reflection point or a short circuit reflection point at the first junction for the first reflective frequency selective limiter to facilitate the transmit signal of interest to travel unaltered downstream along the communication path.

12. The method according to claim 11, further comprising providing an electrical length between the first junction and the short circuit reflection point caused by the first reflective frequency selective limiter equal to 90° plus n multiplied by 180°, where n is an integer equal to or greater than zero.

13. The method according to claim 11, further comprising providing an electrical length between the first junction and the open circuit reflection point caused by the first reflective frequency selective limiter equal to 0° plus n multiplied by 180°, where n is an integer equal to or greater than zero.

14. A transmitter, comprising:
    a plurality of electronic devices configured to facilitate communication of a signal over a communication link, wherein the signal passes through a first junction of a transmit communication path during operation of the transmitter; and
    at least a first reflective frequency selective limiter coupled between the first junction of the transmit communication path and a short or open circuit termination, the first reflective frequency selective limiter configured to (i) provide frequency adaptive spurious signal suppression by attenuating first unwanted components of the signal and (ii) reflect remaining components of the signal so that the remaining components travel downstream along the transmit communication path.

15. The transmitter according to claim 14, wherein the first reflective frequency selective limiter has a short circuit termination.

16. The transmitter according to claim 15, wherein an electrical length between the first junction and the short circuit termination is equal to 180° plus n multiplied by 180°, where n is an integer equal to or greater than zero.

17. The transmitter according to claim 14, wherein the first reflective frequency selective limiter has an open circuit termination.

18. The transmitter according to claim 17, wherein an electrical length between the first junction and the open circuit termination is equal to 90° plus n multiplied by 180°, where n is an integer equal to or greater than zero.

19. The transmitter according to claim 17, wherein the open circuit termination comprises at least one of an open wire, a microstrip, a waveguide, a strip line, a radial stub, and a filter integrated stub.

20. The transmitter according to claim 14, further comprising a second reflective frequency selective limiter coupled to a second junction of the transmission line through which the signal passes.

21. The transmitter according to claim 20, wherein the first and second reflective frequency selective limiters have a parallel arrangement.

22. The transmitter according to claim 20, wherein first and second junctions are located adjacent to each other along the transmission line.

23. The transmitter according to claim 20, wherein the first reflective frequency selective limiter is located after a first electronic device of the plurality of electronic devices and the second reflective frequency selective limiter is located after a second electronic device of the plurality of electronic devices.

24. The method according to claim 1, wherein the transmit communication path comprises a fixed frequency filter connected between a power amplifier and an antenna terminal.

* * * * *